US005130673A

United States Patent [19]

McJunkin

[11] Patent Number: 5,130,673

[45] Date of Patent: Jul. 14, 1992

[54] VARACTOR TUNED COAX RESONATOR

[75] Inventor: Barton L. McJunkin, Spokane, Wash.

[73] Assignee: Hewlett-Packard Company, Palo Alto, Calif.

[21] Appl. No.: 720,313

[22] Filed: Jun. 25, 1991

Related U.S. Application Data

[62] Division of Ser. No. 549,332, Jul. 5, 1990, Pat. No. 5,045,825.

[51] Int. Cl.[5] .......................... H01P 7/04; H03B 5/18

[52] U.S. Cl. ...................................... 331/96; 331/101; 331/117 D; 331/177 V; 333/223; 333/250

[58] Field of Search .................. 331/96, 97, 101, 103, 331/107 C, 117 D, 177 V; 333/219, 222, 223, 227, 230, 231, 250

[56] References Cited

U.S. PATENT DOCUMENTS 3,315,180 4/1967 Racy .............................. 331/101 X 3,614,665 10/1971 Weller et al. .............. 331/117 D X

*Primary Examiner*—Siegfried H. Grimm

[57] ABSTRACT

A broadband, varactor-tuned shorted coax resonator is provided with a single point coupling port that facilitates coupling of discrete circuitry to the distributed resonator to form an oscillator. The coupling port is defined by adding a second shorted coax line across the end of the first. The outer conductors of the two lines are interconnected. The inner conductors of the two lines are serially coupled and define a coupling gap, either along their length or at their ends, across which discrete circuitry can be connected. In a preferred form of the invention, the discrete circuitry is positioned in a region within the periphery of one of the inner conductors in order to provide an electromagnetic shield for the circuitry.

9 Claims, 4 Drawing Sheets

VARACTOR TUNED COAX RESONATOR

This application is a division of application Ser. No. 549,332, filed July 5, 1990, now U.S. Pat. No. 5,045,825.

TECHNICAL FIELD

The present invention relates to resonators, and more particularly relates to a coupling structure that permits coupling to a resonator consisting of multiple capacitive elements and a distributed inductance in such a manner that the resonator operates in the desired mode as a Thevenin equivalent tuned circuit.

BACKGROUND AND SUMMARY OF THE INVENTION

The power handling capability of a single capacitive element can be limited by power dissipation, voltage breakdown or, especially in the case of varactors, excessive capacitance distortion due to applied RF voltage.

In many resonators, it is desirable to combine multiple capacitive elements into a single Thevenin equivalent capacitor with increased power handling capability. It should be noted that capacitive elements can mean discrete capacitors, voltage variable capacitors, etched capacitors on a substrate, or combinations thereof. In high frequency resonators, it is difficult to connect several capacitors to a single discrete inductor. A popular solution is to connect the several capacitors to a distributed inductance.

One logical configuration for such a distributed inductor is a shorted coaxial line, as illustrated in FIG. 1. The end plate 10 short circuits the outer conductor 12 and inner conductor 14 at one end. Capacitors 16 couple the outer conductor and inner conductor at the other end.

The shorted coaxial resonator is advantageous in that the separation of the conductors can be as large as necessary to contain a desired number of radially connected capacitors without affecting the inductance of the resonator. The inductance of the shorted coaxial line is expressed by the following equation:

$$L=(Z\mu/2\pi)^{*}\ln(b/a) \quad (1)$$

where Z is the length of the line, $\mu$ is the magnetic permeability of free space, b is the radius of the line's outer conductor, and a is the radius of the line's inner conductor. The inductance is a function of the ratio of the radii of the outer and inner conductors and is not dependent on the absolute diameter of the shorted coaxial line.

All distributed resonators exhibit resonance at a number of different frequencies. Establishing the desired resonance mode to be the dominant mode is critical in applications, such as oscillators, that are susceptible to operation at several frequencies. The desired resonance mode is a transverse magnetic (TM) wave in the axial direction of the shorted coaxial line, as illustrated in FIGS. 2*a* and 2*b*. The magnetic field lines are perpendicular (transverse) to the direction of wave propagation. The electric field lines are radially symmetric and equal in magnitude and sign in any cross-sectional plane of the resonator. Since the electric field lines are symmetric, each radial capacitor leg will receive an equal share of the resonator power.

While this resonator is advantageous in certain respects, it is disadvantageous in others. Since the resonator is, by nature, a distributed circuit element, a distributed coupling technique is typically employed. Such techniques generally involve electromagnetic coupling to the resonator, such as by a coupling loop (as shown in U.S. Pat. No. 3,735,286), electrode or probe that causes an electromagnetic field to propagate into the resonant structure. Such coupling techniques are disadvantageous in certain applications that require a high degree of coupling to the Thevenin equivalent of the resonator.

A second disadvantage in coupling to the short-circuited coaxial resonator is a difficulty in establishing a desired resonance mode. General coupling techniques can excite several different modes of resonance. One disadvantageous mode is the transverse electric (TE) mode, as illustrated in FIGS. 3*a* and 3*b*. The electric field is perpendicular (transverse) to the direction of wave propagation, and in any cross-sectional plane, the electric field does not have a radial distribution. This wave causes unequal power division of the resonator power into the capacitors.

In accordance with the preferred embodiment of the present invention, these drawbacks are overcome by providing a coupling port to a multiple capacitor, short circuited coax resonator. This port is defined by adding a second short circuited coax line across the end of the first. The outer conductors of the lines are interconnected. The inner conductor of the second line can be a wire, cylindrical element or reactive element such as a coil. The outer conductor of the second line can be cylindrical or a finite approximation, such as a hexagonal can, for ease of manufacturing. The inner conductors of the two lines are serially coupled and define, either along their length or at their ends, a coupling gap across which discrete circuitry can be connected. In a preferred form of the invention, the discrete circuitry is positioned in a region within the periphery of one of the inner conductors in order to provide an electromagnetic shield for the circuitry. By maintaining the radial symmetry of the resonator and coupler, the dominant resonance mode is a TM wave. The coupling port presents to the discrete circuitry a Thevenin equivalent tuned circuit composed of the sum of the capacitance of the symmetric legs in parallel with the inductance of the short circuited coaxial line.

The foregoing and additional features and advantages of the present invention will be more readily apparent from the following detailed description thereof, which proceeds with reference to the accompanying drawings.

DETAILED DESCRIPTION

Figure 1:
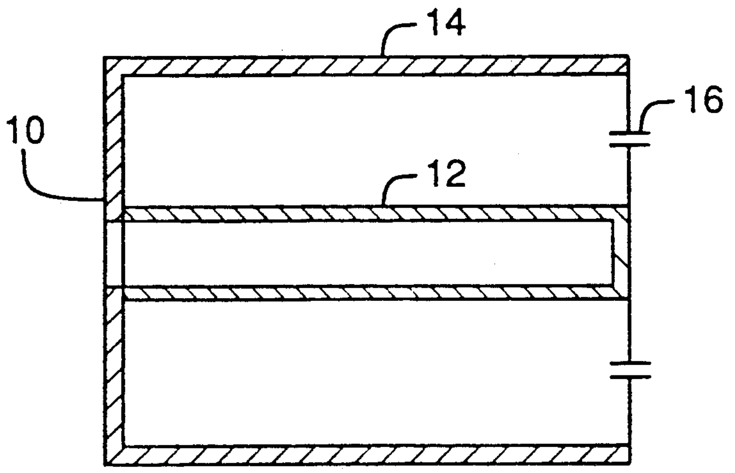
FIG. 1 Prior Art
FIG. 1 is a sectional view of a prior art shorted coax resonator with radial capacitors.
Figure 4:
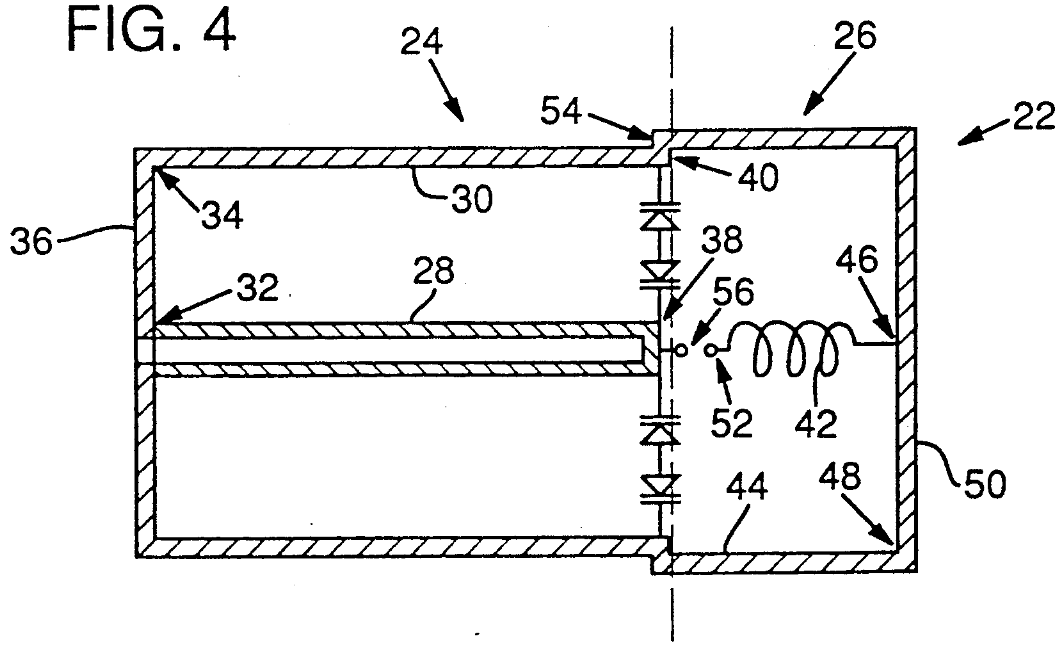
FIG. 4 is a simplified sectional view of a shorted coax resonator according to one embodiment of the present invention.
Figure 2A:
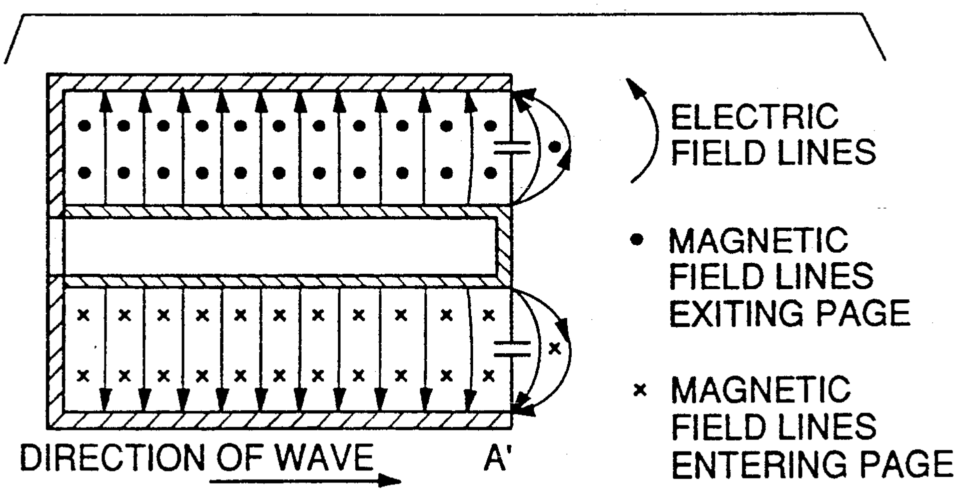
FIGS. 2*a* and 2*b* are illustrations of a transverse magnetic wave in a coax resonator.
Figure 2B:
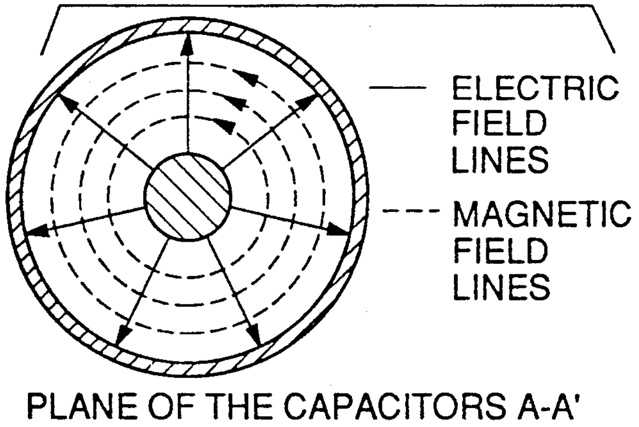
Figure 3B:
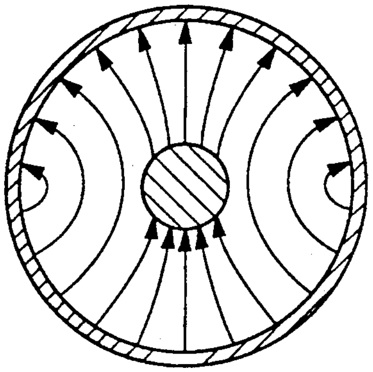
FIGS. 3*a* and 3*b* are illustrations of a transverse electric wave in a coax resonator.
Figure 3A:
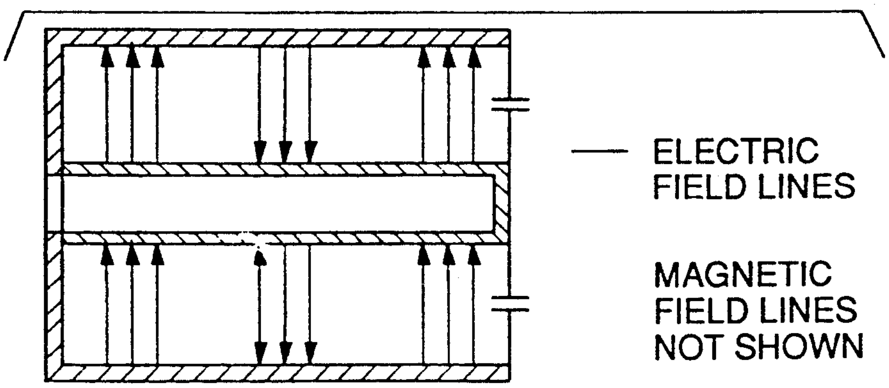

Referring to FIG. 4, a resonator 22 according to one embodiment of the present invention includes two shorted coax lines 24, 26. The first line 24 includes an inner conductor 28 coaxially disposed within an outer conductor 30. Both of these conductors are connected at first ends 32, 34 thereof to a first conductive end member 36. These conductors extend away from the end member 36 and terminate at second ends 38, 40, respectively.

The second shorted coax line 26 includes a second inner conductor 42 coaxially disposed within a second outer conductor 44. These conductors are connected at first ends 46, 48 thereof to a second conductive end member 50 and extend therefrom, terminating at second ends 52, 54, respectively.

(In the illustrated embodiment, the diameter of the second outer conductor 44 is greater than the diameter of the first outer conductor 30, but in other embodiments these diameters can have different relationships.)

The outer conductors of the first and second shorted coax lines 24, 26 are connected at their second ends 40, 54. The seconds ends 38, 52 of the inner conductors approach each other but do not interconnect. Instead, they define a gap 56 across which discrete circuitry can be connected to effect a single point coupling to the resonator.

Figure 5:
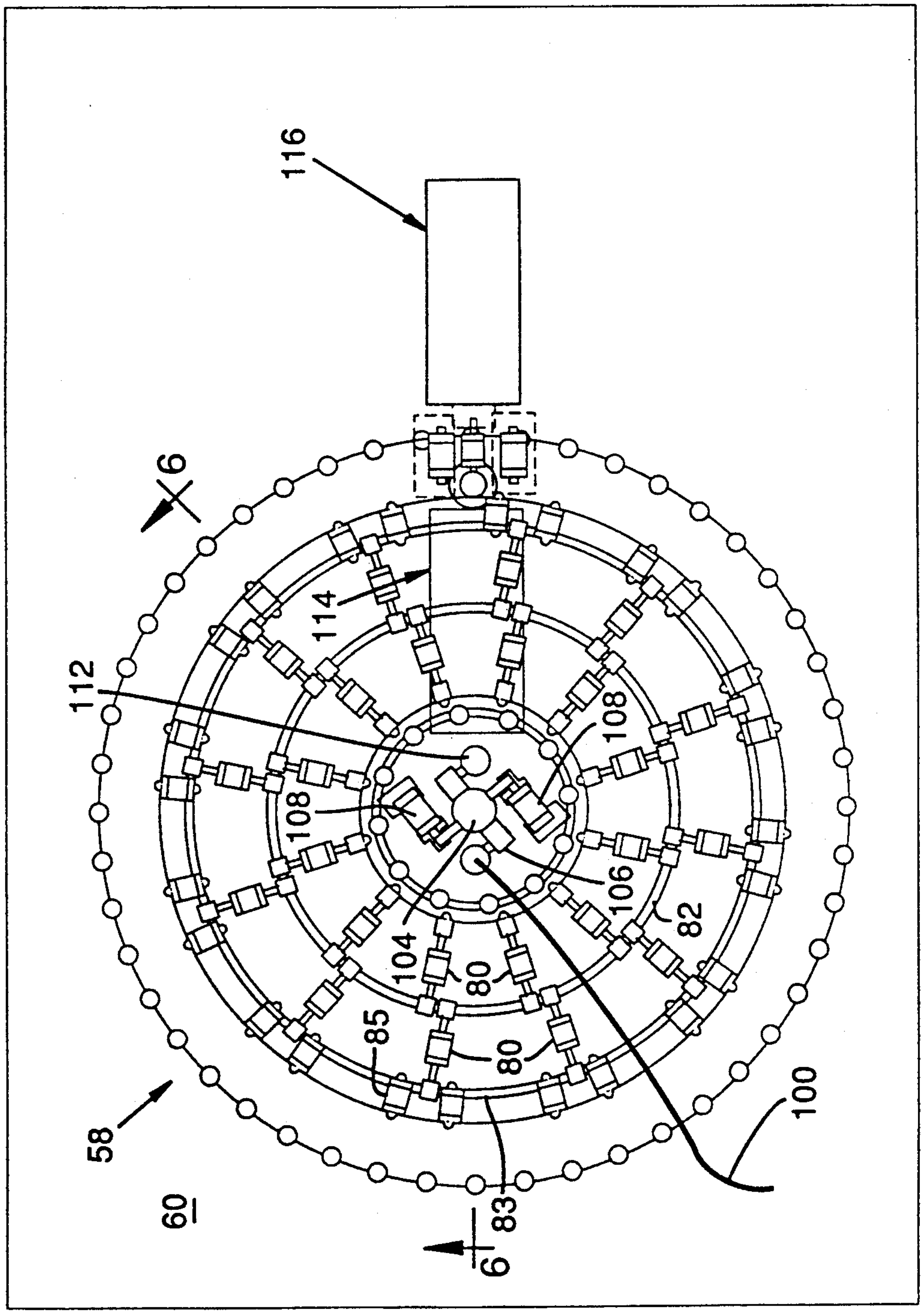
FIG. 5 is a top plan view of a printed circuit board employed in a printed circuit board resonator according to one embodiment of the present invention.
Figure 6:
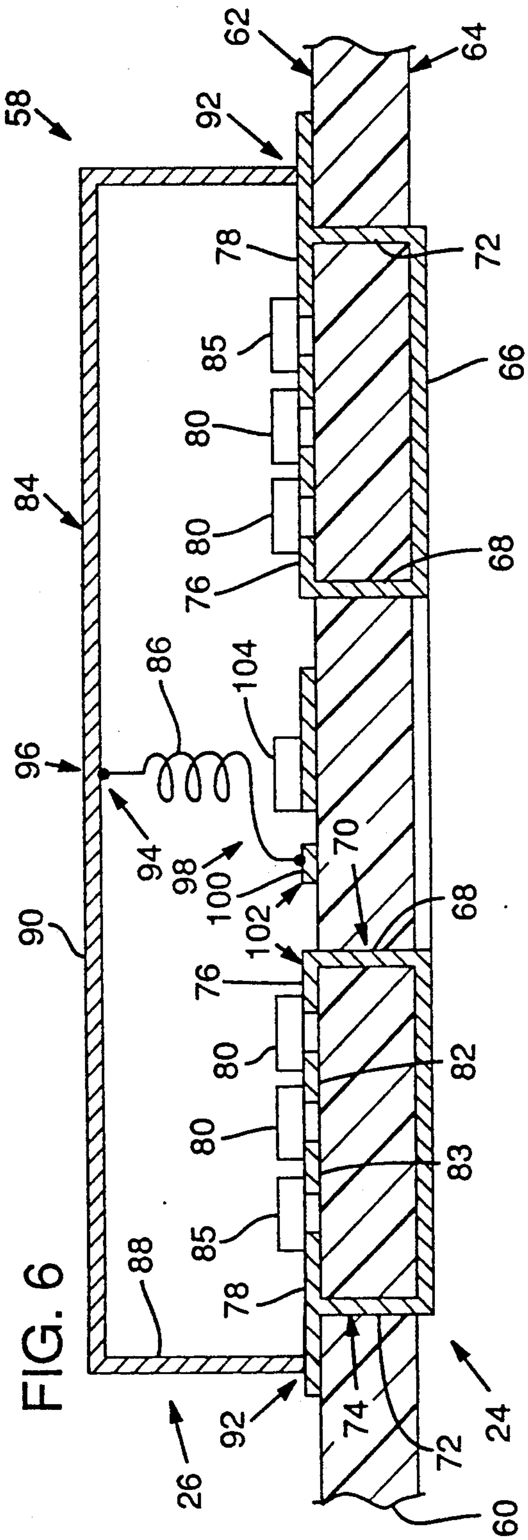
FIG. 6 is a sectional view (not to scale) taken on lines 6—6 of FIG. 5.

FIGS. 5 and 6 show a printed circuit board resonator 58 and illustrate one arrangement by which discrete circuitry can be connected across the coupling gap 56. In this resonator, the first shorted coax line 24 comprises a 0.062 inch thick FR4 circuit board 60 that has first and second surfaces 62, 64. Through this board extend a first plurality of plated vias 68 that define the periphery of an inner conductor 70, and a second plurality of plated vias 72 that define the periphery of an outer conductor 74. The second surface is plated with copper 66 between the periphery of the inner conductor 70 and the periphery of the outer conductor 74. Each of the vias is connected to the metal plating 66 on the second surface 64 of the board. Each of the first plurality of vias 68 is connected at its other end to a circular metal trace 76 on the first side of the board, and each of the second plurality of vias 72 is connected at its other end to a circular metal trace 78. Trace 76 defines the end of the inner conductor, and trace 78 defines the end of the outer conductor.

The structure so-far described corresponds to the end plate 36 and first inner and outer conductors 28, 30 of the first shorted coax line 24 in the resonator of FIG. 4. The metal plating 66 on the second surface of the board serves as the end plate. The concentric inner and outer conductors are cage-like finite element structures defined by the plated vias and the metal traces at which they terminate. It will be recognized that first shorted coax line here has an FR4 dielectric, as opposed to the air dielectric used in the resonator 22 of FIG. 4. The linear extent of this first coax line is only 0.062 inches—the thickness of the circuit board.

The resonator 58 is tuned by a plurality of voltage-variable capacitance elements, such as back-to-back varactors 80, that are disposed on the board's first surface 62. The illustrated varactors, each with a capacitance range of about 6 to 30 picofarads, serve to couple (through large bypass capacitors 85) the inner and outer conductor ends 76, 78. A first metal circuit board trace 82 interconnects the back-to-back anodes of the varactors to provide a common coarse tuning terminal. A second metal circuit board trace 83 interconnects the cathodes of the varactors closest to the outer conductor and provides a common fine tuning terminal. These cathodes are connected by capacitors 85 to the trace 78 that defines the end of the outer conductor 74. In one embodiment, the printed circuit board is a multi-layered board and the external interconnects to the tuning traces 82, 83 are formed on one of the intermediate board layers.

The second shorted coax line 26 (FIG. 6) comprises an electrically conductive can 84 and an inner conductor 86. The can includes a cylindrical side wall 88 that serves as the outer conductor of this second coax line, and additionally includes a planar end wall 90. The cylindrical side wall is connected at its periphery 92 to the metal trace 78 that defines the end of the first line's outer conductor. The inner conductor 86 is positioned in the volume defined by this can. The conductor 86 has a first end 94 connected to a central region 96 of the end wall 90, and a second end 98 that connects to a metal pad 100 on the first surface of the circuit board, inside the perimeter of the first inner conductor 70. Pad 100 and trace 76 together define the resonator's coupling port 102. Coupling to the resonator is effected by connecting discrete circuitry between these points.

Figure 7:
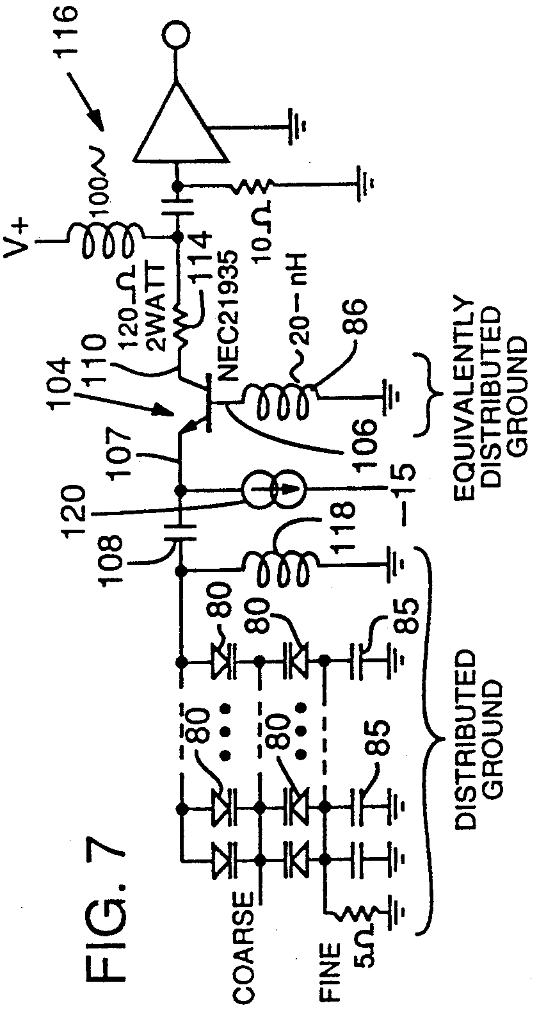
FIG. 7 is a schematic diagram of an oscillator with which the resonator is used.

In the illustrated circuit board resonator 58, the discrete circuitry is a NEC21935 oscillator transistor 104 whose base terminal 106 is connected to the pad 100, and whose emitter terminals 107 (FIG. 7) are coupled to the inner conductor trace 76 through 0.1 microfarad coupling capacitors 108. The emitter bias current source is externally connected via a trace on an intermediate layer. The transistor's collector terminal 110 is connected to a pad 112 from which a 120 ohm power resistor 114 extends to outside the resonator, where it attaches to bias circuitry/buffer amplifier 116. The oscillator's schematic is shown in FIG. 7.

Conductor 86 can take many forms but in the illustrated embodiment is a small diameter conductor wound into a 20 nanohenry coil that isolates the base of the transistor 104 from RF ground.

Since the ground of the resonator is radially distributed about the outer conductor of the first shorted line, the ground to which the transistor base is grounded must similarly be radially distributed. Such a radially distributed base ground is established by connecting the inner conductor 86 of the second shorted coax line to the center of the can 84. This coupling method assures that the dominant resonance mode of the resonator is a TM wave.

The illustrated oscillator operates over a frequency range of about 500–1,000 MHz. The Thevenin equivalent tuned circuit has an inductance 118 (FIG. 7) of about 0.6 nanohenries. This inductance is a function of the dimensions of the first shorted coax line, as expressed by equation (1), set forth above.

The illustrated arrangement provides a number of advantages over the prior art. Primary among these is the resonator's provision of a single point coupling port to which discrete circuitry can be coupled. Coupling at this port converts the distributed resonator into a Thevenin equivalent LC circuit. This topology further stimulates the desired TM resonance mode while suppressing unwanted resonances.

The illustrated coupling structure also permits the discrete circuitry to be shielded by positioning such circuitry inside the inner conductor of one of the two shorted coax lines. The resonator's electromagnetic fields are confined between the inner and outer conductors of these lines, and extraneous electromagnetic fields are excluded by the conductive walls that define and enclose the cavity.

When used as the tuned element of an oscillator, the illustrated resonator 58 yields oscillator phase noise 20 dB below other state of the art oscillators. This improvement is due to the increased power handling capability of the resonator. Low power in a resonator causes a high noise floor in an oscillator. Too much power in a varactor tuned resonator causes excessive AM-FM noise conversion due to capacitance distortion. A distributed resonator is capable of handling more power than a discrete resonator since the power is distributed among several low power components.

Figure 8:
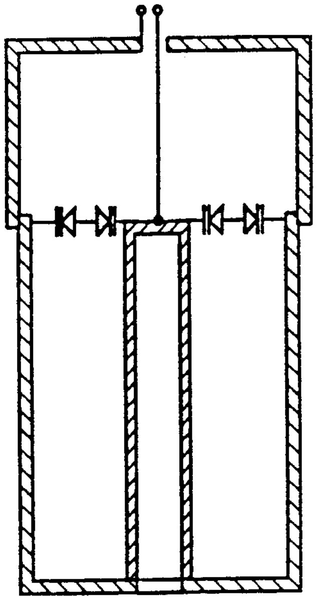
FIG. 8 is a sectional view of a resonator according to the present invention in which the coupling gap is formed between an end of an internal conductor and a central portion of a conductive end member.

Having described and illustrated the principles of my invention with reference to a preferred embodiment thereof, it will be apparent that the invention can be modified in arrangement and detail without departing from such principles. For example, while the invention has been illustrated with reference to a varactor-tuned, shorted coaxial resonator, the principles thereof can similarly be applied to a variety of other resonator topologies. Furthermore, while the invention has been illustrated with reference to an embodiment in which the coupling gap is formed at the end of the second inner conductor nearest the inner cavity conductor, in other embodiments, the gap may be formed at the other end of the conductor, i.e. between the end 94 of the coil and the central region 96 of the end wall 90. Such an embodiment permits the coupling port to be accessible from outside the resonator, if desired, as shown in FIG. 8.

In view of the many possible embodiments to which the principles of my invention may be put, it should be recognized that the detailed embodiment is illustrative only and should not be taken as limiting the scope of my invention. Rather, I claim as my invention all such embodiments as may come within the scope and spirit of the following claims and equivalents thereto.

I claim:

1. A resonator comprising:

a substrate having first and second surfaces;

a first plurality of interconnected conductive vias extending through the substrate from the first to second surfaces to define the periphery of an inner cavity conductor;

a second plurality of interconnected conductive vias extending through the substrate from the first to second surfaces to define the periphery of an outer cavity conductor;

the second surface of the substrate being electrically conductive in a region between the periphery of the inner cavity conductor and the periphery of the outer cavity conductor;

a plurality of capacitive elements coupling the peripheries of the inner and outer cavity conductors;

an electrically conductive can member connected at its periphery to the outer cavity conductor and shielding the first surface of the substrate; and an inductive conductor having a first end coupled to a central region of the conductive can member and having a second end coupled to the periphery of the inner cavity conductor.

2. The resonator of claim 1 in which the first end of the inductive conductor is connected to the central region of the conductive can member, and the second end of the inductive conductor defines a coupling gap with the inner cavity conductor.

3. The resonator of claim 2 in which the second end of the inductive conductor is connected to circuitry disposed on the substrate within the periphery of the inner cavity conductor, said circuitry coupling said second end to the periphery of the inner cavity conductor.

4. The resonator of claim 3 in which the circuitry includes a transistor, and in which the second end of the inductive conductor is connected to a first terminal of the transistor, and a second terminal of the transistor is coupled to the periphery of the inner cavity conductor.

5. The resonator of claim 4 in which the second terminal of the transistor is coupled to the periphery of the inner cavity conductor through a coupling capacitor.

6. The resonator of claim 1 in which the second end of the inductive conductor is connected to the periphery of the inner cavity conductor, and the first end of the inductive conductor defines a coupling gap with the central region of the conductive can member.

7. The resonator of claim 1 in which each of the capacitive elements comprises a voltage variable capacitor element, and in which each of said elements has a terminal to which a tuning voltage may be applied, the terminals of said elements being interconnected to provide a common tuning terminal.

8. The resonator of claim 7 in which the substrate has a plurality of layers defining at least three surfaces, and in which one of said surfaces defines a conductor that externally connects said common tuning terminal to an external tuning source.

9. The resonator of claim 1 in which the substrate is a printed circuit board.

* * * * *